(12) United States Patent
Rhodes

(10) Patent No.: US 6,285,038 B1
(45) Date of Patent: Sep. 4, 2001

(54) INTEGRATED CIRCUITRY AND DRAM INTEGRATED CIRCUITRY

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/516,819

(22) Filed: Mar. 1, 2000

(51) Int. Cl.$^7$ .................................................. H01L 47/00
(52) U.S. Cl. ........................ 257/3; 257/296; 257/4; 427/534
(58) Field of Search ................... 438/666, 657, 438/674, 676; 257/3, 4, 300, 301, 302, 306

(56) References Cited

U.S. PATENT DOCUMENTS

| | | |
|---|---|---|
| 5,747,116 | 5/1998 | Sharan et al. . |
| 6,086,960 * | 7/2000 | Kim et al. ............................ 427/534 |
| 9,360,292 | 7/1999 | Sharan et al. . |

* cited by examiner

Primary Examiner—David Nelms
Assistant Examiner—Dung A Le

(74) Attorney, Agent, or Firm—Wells, St. John, Roberts, Gregory & Matkin, P.S.

(57) ABSTRACT

The invention comprises integrated circuitry fabrication methods of making a conductive electrical connection, methods of forming a capacitor and an electrical connection thereto, methods of forming DRAM circuitry, integrated circuitry, and DRAM integrated circuitry. In one implementation, an integrated circuitry fabrication method of making a conductive electrical connection includes forming a conductive layer including a conductive metal oxide over a substrate. The conductive layer has an outer surface. At least a portion of the conductive layer outer surface is exposed to reducing conditions effective to reduce at least an outermost portion of the metal oxide of the conductive layer, most preferably by removing oxygen. Conductive material is formed over the reduced outermost portion and in electrical connection therewith. In one implementation, integrated circuitry includes a conductive metal oxide comprising layer received over a substrate. The conductive metal oxide comprising layer has at least one localized region. At least an outermost portion of the localized region has less oxygen content than a region of the conductive metal oxide comprising layer immediately laterally adjacent the at least one localized region. Other aspects and implementations are disclosed or contemplated.

29 Claims, 11 Drawing Sheets

F I G. II

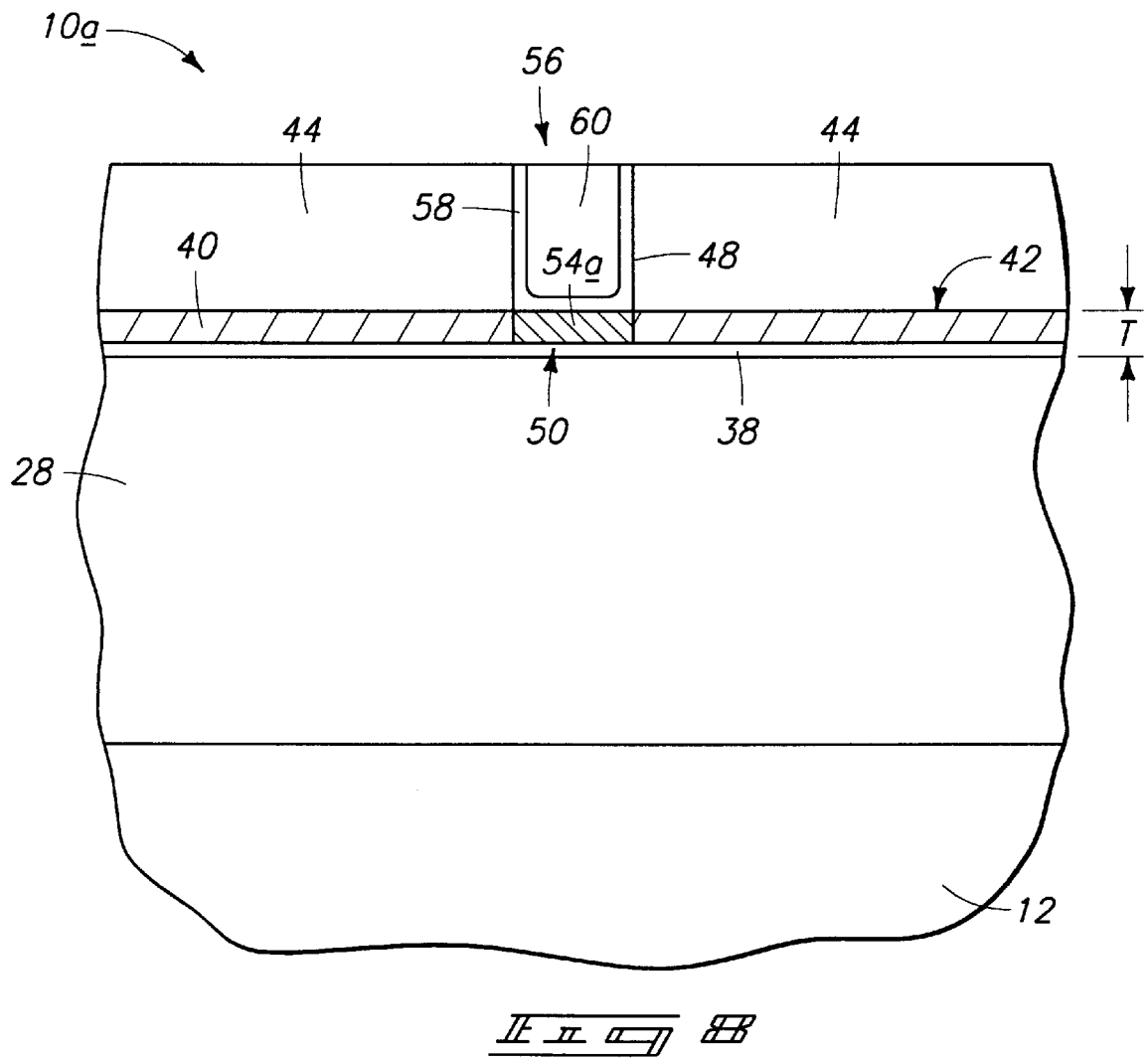
F I G 8

US 6,285,038 B1

INTEGRATED CIRCUITRY AND DRAM INTEGRATED CIRCUITRY

TECHNICAL FIELD

This invention relates to integrated circuitry fabrication methods of making a conductive electrical connection, to methods of forming a capacitor and an electrical connection thereto, to methods of forming DRAM circuitry, and to integrated circuitry such as DRAM integrated circuitry.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics as well as the cell structure are important. The feature size of 256 Mb DRAMs and beyond will be on the order of 0.25 micron or less, and conventional dielectrics such as $SiO_2$ and $Si_3N_4$ might not be suitable because of small dielectric constants.

Highly integrated memory devices, such as 256 Mbit DRAMs and beyond, are expected to require a very thin dielectric film for the 3-dimensional capacitor of cylindrically stacked or trench structures. To meet this requirement, the capacitor dielectric film thickness will be below 2.5 nm of $SiO_2$ equivalent thickness. Insulating inorganic metal oxide materials have high dielectric constants and low leakage current which make them attractive as cell dielectric materials for high density DRAMs and non-volatile memories. Most all of these materials incorporate oxygen and are otherwise exposed to oxygen and anneal for densification to produce the desired capacitor dielectric layer.

In many such applications, it will be desirable to utilize conductive metal oxides as the principal material for one or both of the conductive capacitor electrodes. Conductive contact to the outer, or cell, electrode layer in DRAM circuitry is typically made through a contact opening formed within an electrically insulative material. The opening is subsequently filled with one or more conductive materials, such as titanium, titanium nitride and/or tungsten, to form the conductive contact to the cell electrode. Unfortunately, these materials are capable of oxidizing to a non-conducting metal oxide upon effective exposure to the overlying conductive metal oxide. For example, exposure to temperature as low as 200° C. can cause oxygen from the conductive metal oxide to react with one or more of titanium, titanium nitride and tungsten to form an insulative oxide, and effectively block the electrical connection.

Overcoming such problem in DRAM circuitry fabrication was a motivation for the invention, but the invention is in no way so limited.

SUMMARY

The invention comprises integrated circuitry fabrication methods of making a conductive electrical connection, methods of forming a capacitor and an electrical connection thereto, methods of forming DRAM circuitry, integrated circuitry, and DRAM integrated circuitry. In one implementation, an integrated circuitry fabrication method of making a conductive electrical connection includes forming a conductive layer including a conductive metal oxide over a substrate. The conductive layer has an outer surface. At least a portion of the conductive layer outer surface is exposed to reducing conditions effective to reduce at least an outermost portion of the metal oxide of the conductive layer, most preferably by removing oxygen. Conductive material is formed over the reduced outermost portion and in electrical connection therewith.

In one implementation, a method of forming a capacitor and an electrical connection thereto includes forming a pair of capacitor electrodes having a capacitor dielectric layer therebetween over a substrate. At least one of the capacitor electrodes includes a conductive metal oxide. An insulating layer is formed over the capacitor electrodes. A contact opening is formed into the insulating layer over the one capacitor electrode. The one capacitor electrode under the contact opening is exposed to conditions effective to remove at least some of the oxygen of the metal oxide from at least an outermost portion of the one capacitor electrode. Conductive material is formed within the contact opening in electrical connection with the one capacitor electrode.

In one implementation, integrated circuitry includes a conductive metal oxide comprising layer received over a substrate. The conductive metal oxide comprising layer has at least one localized region. At least an outermost portion of the localized region has less oxygen content than a region of the conductive metal oxide comprising layer immediately laterally adjacent the at least one localized region.

Other aspects and implementations are disclosed or contemplated.

BRIEF DESCRIPTION OF THE DRAWINGS

Preferred embodiments of the invention are described below with reference to the following accompanying drawings.

FIG. 8 is a view of the exemplary alternate embodiment, and corresponds in position and sequence to that depicted by FIG. 7.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention comprises methods of fabricating integrated circuitry, and integrated circuitry independent of the method of fabrication. A preferred embodiment is described in conjunction with fabrication of DRAM integrated circuitry and in a finished DRAM integrated circuitry product. The invention has applicability to methods of fabricating other integrated circuitry, and to other integrated circuitry products independent of method of fabrication as will be appreciated by the artisan, with the invention only being limited by the accompanying claims appropriately interpreted in accordance with the Doctrine of Equivalents.

Figure 1:
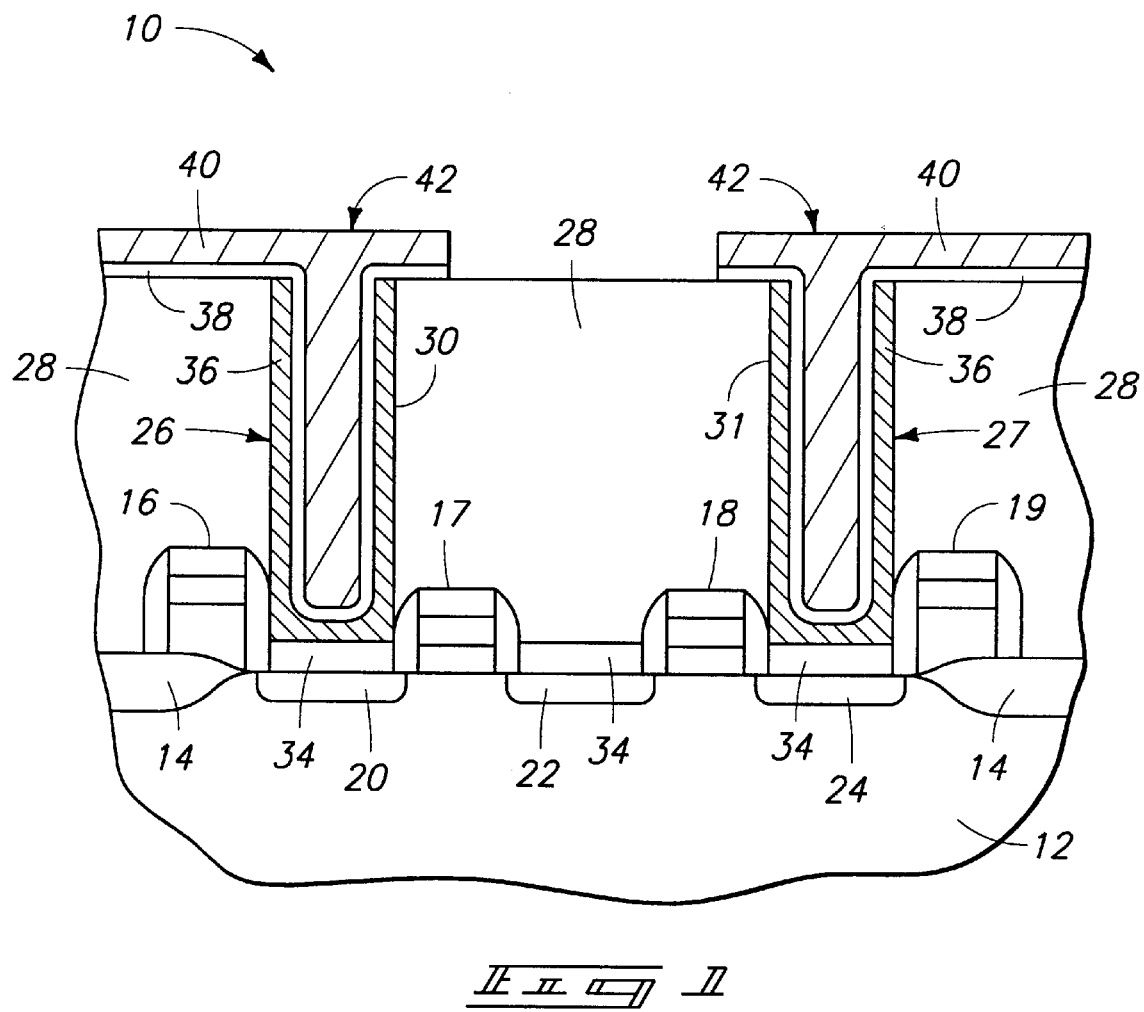
FIG. 1 is a diagrammatic sectional view of a semiconductor wafer fragment comprising example DRAM integrated circuitry in fabrication in accordance with an aspect of the invention.

Referring to FIG. 1, a wafer fragment 10 comprises a bulk monocrystalline silicon substrate 12 having a pair of field isolation regions 14. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A series of four DRAM word line constructions 16, 17, 18 and 19 are formed over the illustrated substrate, and comprise gates of respective DRAM cell field effect transistors. Gate constructions 16, 17, 18 and 19 are conventional as shown, and comprise a gate dielectric layer (not shown), an overlying conductive polysilicon region, an overlying higher conductive elemental metal or silicide region, and an insulative cap and sidewall spacers, and which are not otherwise specifically identified with numerals. In the illustrated section, word line 17 comprises a transistor access gate having associated source/drain diffusion regions 20 and 22 formed within monocrystalline silicon substrate 12. Similarly, DRAM word line 18 comprises a gate of a DRAM cell field effect transistor having an associated pair of source/drain diffusion regions 22 and 24. Such depicts two DRAM cells which share a source/drain region 22 which will electrically connect with a bit line, as described subsequently. The other respective source/drain diffusion regions 20 and 24 are formed in electrical connection with DRAM cell capacitor constructions 26 and 27, respectively. The illustrated example is in the fabrication of bit line-over-capacitor DRAM integrated circuitry construction, although other DRAM integrated circuitry and other integrated circuitry constructions and fabrication methods are contemplated.

Conductive covering regions 34 are formed over source/drain regions 20, 22 and 24. Such might be formed to have outermost surfaces or tops which are received elevationally below the outermost top surfaces of gate constructions 16–19 as shown, or received elevationally thereabove (not shown). Such might comprise conductive polysilicon, metals, and/or metal compounds, including conductive barrier layer materials.

An insulating layer 28, for example borophosphosilicate glass (BPSG), is formed over the word lines and is planarized as shown. Capacitor container openings 30 and 31 are formed within insulative layer 28 over source/drain diffusion regions 20 and 24, respectively, and the associated conductive covering regions 34. A capacitor storage node layer 36 is formed within container openings 30 and 31 in electrical connection with source/drain diffusion regions 20 and 24 through conductive covering/plugging material 34. Such can be planarized back to be isolated within the container openings as shown. Example materials include conductively doped polysilicon, metal and metal compounds, with conductive metal oxides being preferred materials. By way of example only, example conductive metal oxides include ruthenium oxide, iridium oxide, osmium oxide, rhodium oxide, $Ru_xRh_yO_z$, $Ru_xIr_yO_z$, $Ru_xSi_yO_z$, $Rh_xSi_yO_z$, $IrSi_xO_y$, and $Os_xSi_yO_z$.

A capacitor dielectric layer 38 is formed over storage node electrode layer 36. Example and preferred materials include high k dielectric materials (i.e., k greater than or equal to 9), such as titanates, pentoxides, $Al_2O_3$, and ferroelectrics generally. A DRAM capacitor cell electrode layer 40 is formed over capacitor dielectric layer 38. Cell electrode layer 40 is preferably common to multiple capacitors of the DRAM circuitry, and preferably comprises a conductive metal oxide. Layer 40 is patterned as desired and shown to provide an opening therethrough to ultimately achieve bit line electrical connection with shared diffusion region 22 (shown and described below), and to otherwise form a desired circuitry pattern thereof outwardly of the fragment depiction of FIG. 1. For purposes of the continuing discussion, cell electrode layer 40 comprises an outer surface 42.

Such depicts but one example of forming a conductive layer, here layer 40, comprising a conductive metal oxide over a substrate. Such comprises also but one example of forming a pair of capacitor electrodes having a capacitor dielectric layer therebetween, where at least one of the capacitor electrodes comprises a conductive metal oxide.

Figure 2:
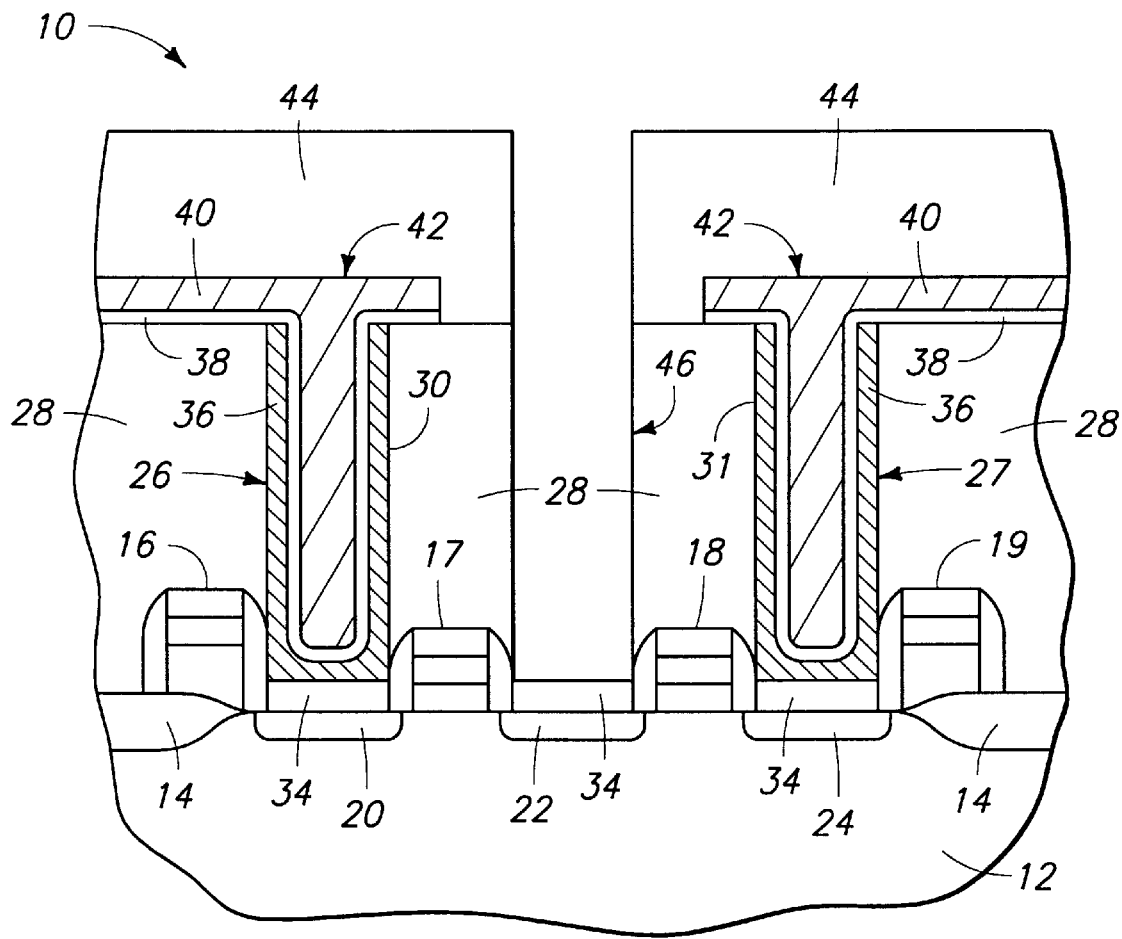
FIG. 2 is a view of the FIG. 1 wafer fragment at a processing step subsequent to that depicted by FIG. 1.
Figure 3:
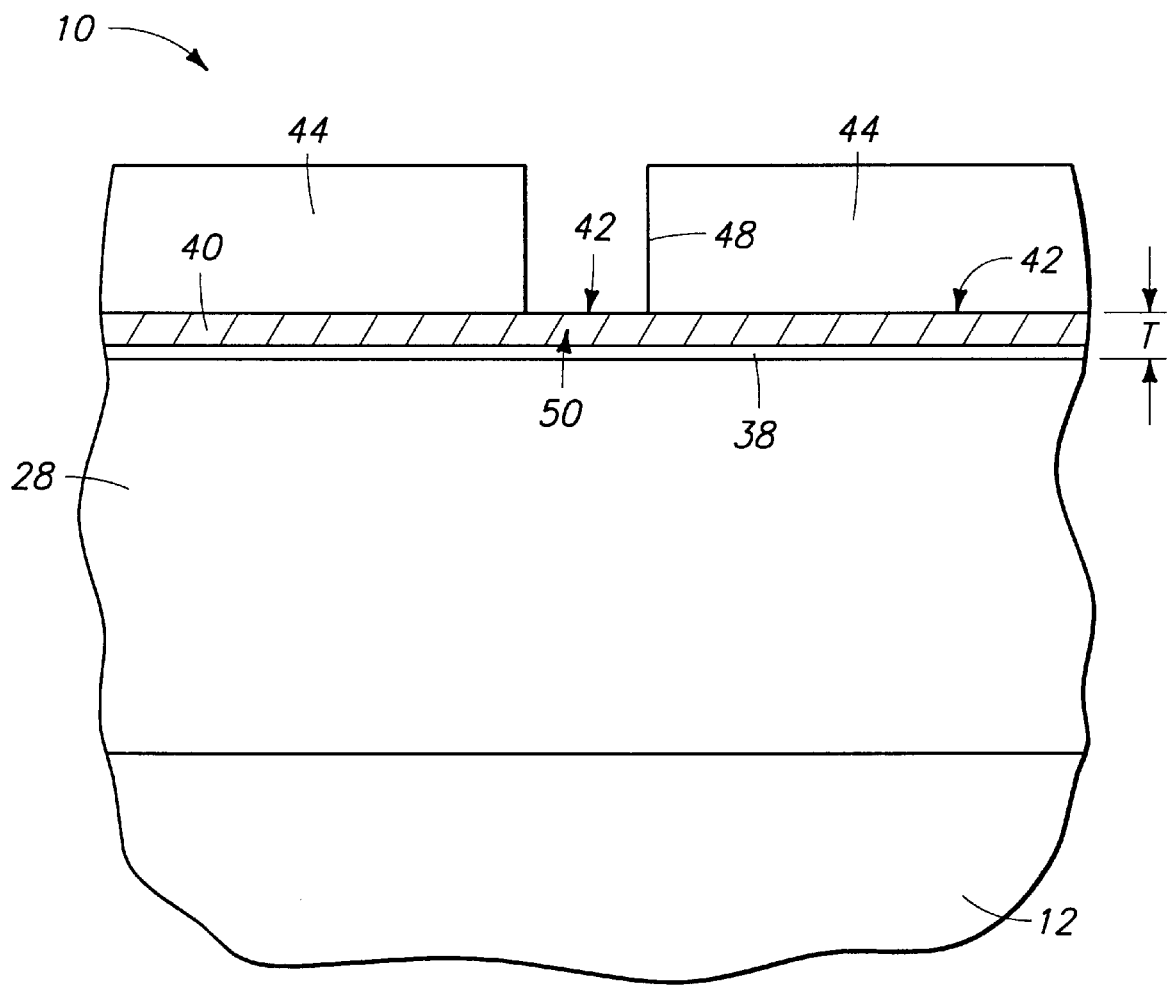
FIG. 3 is a view of the FIG. 2 wafer fragment at a different sectional cut.

Referring to FIGS. 2 and 3, an insulative layer 44 is formed over DRAM capacitor cell electrode layer 40. An example and preferred material is BPSG. A contact opening 46 (FIG. 2) is formed through insulative layers 44 and 28 for ultimate formation of a conductive bit contact. A contact opening 48 (FIG. 3) is formed within insulative layer 44 over conductive metal oxide comprising layer 40, which in the illustrated example is a DRAM cell electrode layer. Preferably and as shown, contact opening 48 is formed entirely through insulating layer 44 and exposes a portion of conductive metal oxide comprising layer 40. Contact opening 48 in this example defines at least one localized region 50 of conductive metal oxide comprising layer 40. Further for purposes of the continuing discussion, conductive metal oxide layer/DRAM capacitor cell electrode layer 40 at localized region 50 has a total thickness "T". Further considered, localized region 50 extends through an entirety of thickness "T" of conductive metal oxide comprising layer 40.

Figure 4:
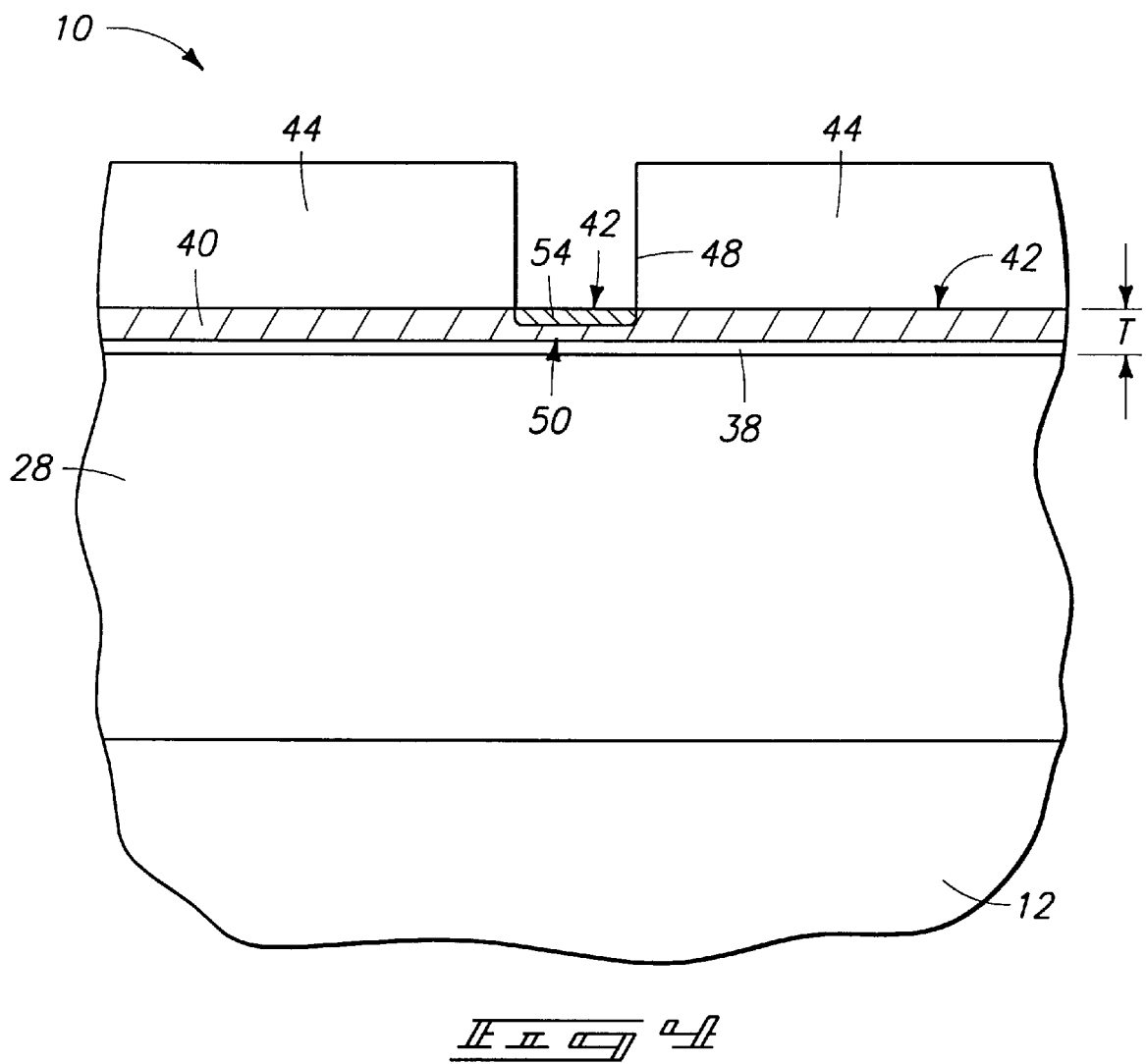
FIG. 4 is a view of the FIG. 3 wafer fragment at a processing step subsequent to that depicted by FIG. 3.

Referring to FIG. 4, DRAM capacitor cell electrode layer 40 is exposed under contact opening 48 to remove at least some of the oxygen of the metal oxide from at least an outermost portion 54 of localized region 50. Such preferably and effectively reduces at least an outermost portion of the metal oxide of conductive layer 40. Thus, at least an outermost portion of localized region 50 comprises less oxygen content than a region of the conductive metal oxide comprising layer 40 immediately laterally adjacent localized region 50.

Figure 5:
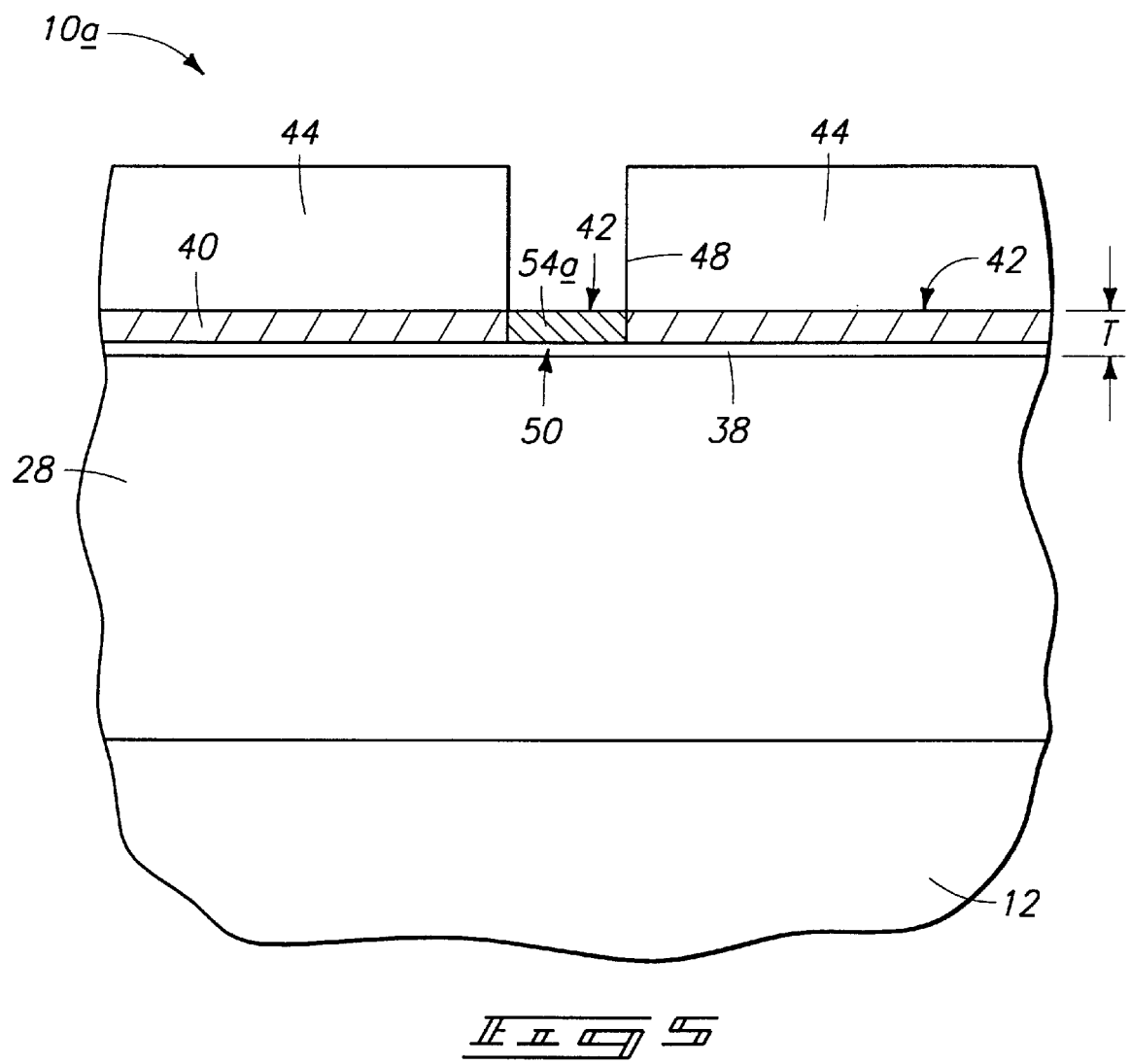
FIG. 5 is a view of an alternate embodiment to that depicted by FIG. 4.

FIG. 4 depicts the exposing being effective to remove at least some of the oxygen from only an outermost portion 54 of localized region 50 of DRAM capacitor cell electrode layer 40. FIG. 5 depicts an alternate embodiment whereby the exposing is effective to remove at least some oxygen of the metal oxide from the entire thickness of localized region 50 of capacitor cell electrode layer 40, thereby forming region 54*a* as shown. In FIG. 5 and subsequent figures pertaining thereto, like numerals from the first embodiment are utilized where appropriate with differences being indicated with the suffix "a", or with different numerals.

Regardless, such exposing is preferably effective to remove oxygen from at least the outer portion to a degree sufficient to leave no more than 15 atomic percent oxygen, and even more preferably no more than 5 atomic percent oxygen, remaining in the outer portion from which such oxygen was removed. Further most preferred, and regardless, the exposing is preferably effective to reduce the metal oxide and form region 54 or 54*a* to constitute a region of elemental or alloy metal from the metal oxide of layer 40. Further most preferred, at least the outermost portion of the localized region is essentially void of oxygen the result of oxygen removal and reduction all the way back to elemental metal or metal alloy.

The exposing preferably comprises exposure to hydrogen (which includes hydrogen containing compounds, such as $NH_3$), nitrogen, helium or argon, and mixtures thereof, or vacuum. Direct plasma and/or remote plasma might be utilized. Most preferable is hydrogen exposure, and even more preferably, hydrogen exposure by ion implantation. A preferred ion implant dose for $H_2$ would be from $1\times10^{15}/cm^2$ to $1\times10^{17}/cm^2$. A preferred temperature range for the exposure conditions is from 200° C. to 800° C. Preferred pressure range is from $10^{-8}$ Torr to above atmospheric.

Figure 6:
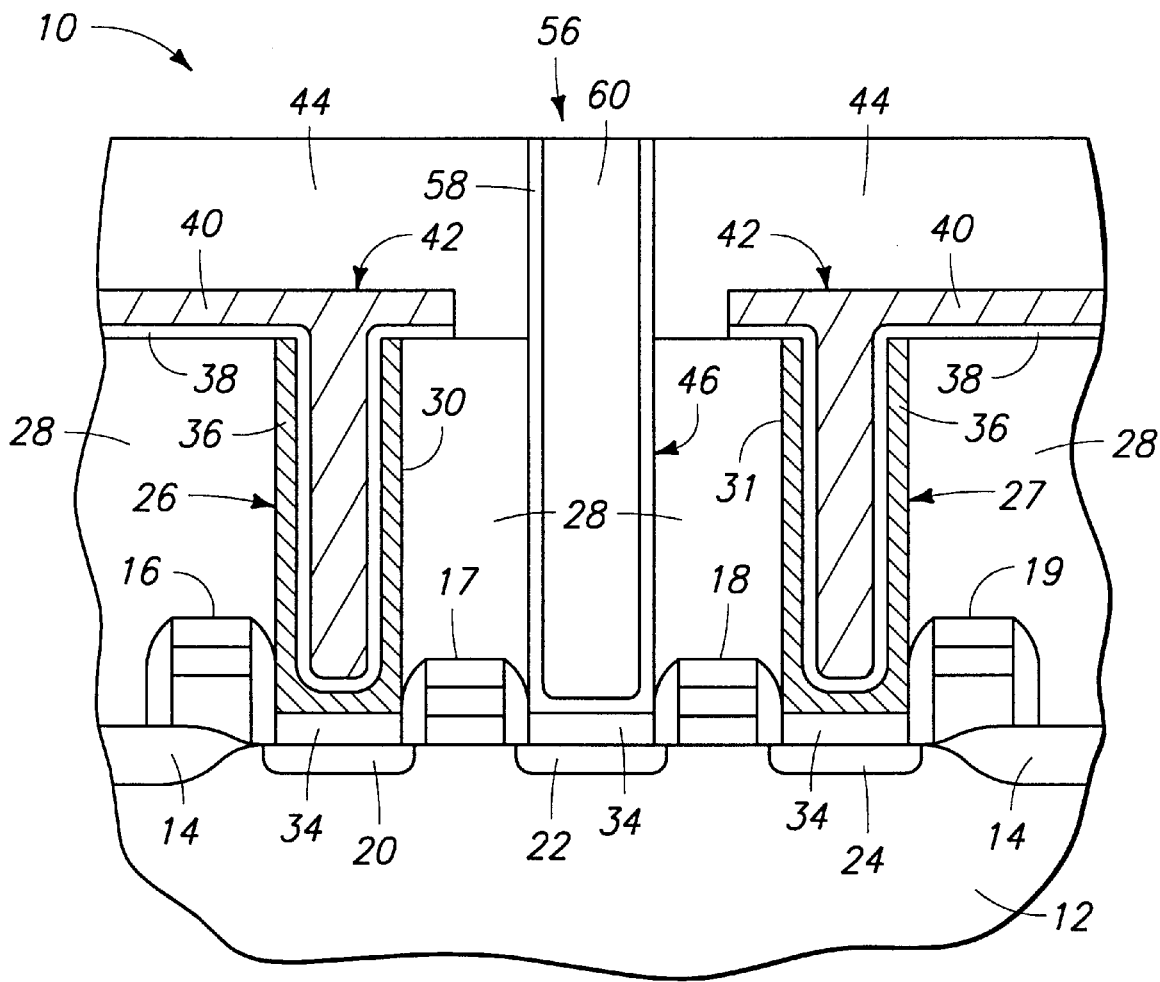
FIG. 6 is a view of the FIG. 2 wafer fragment at a processing step subsequent to that depicted by FIG. 2 and FIG. 4.
Figure 7:
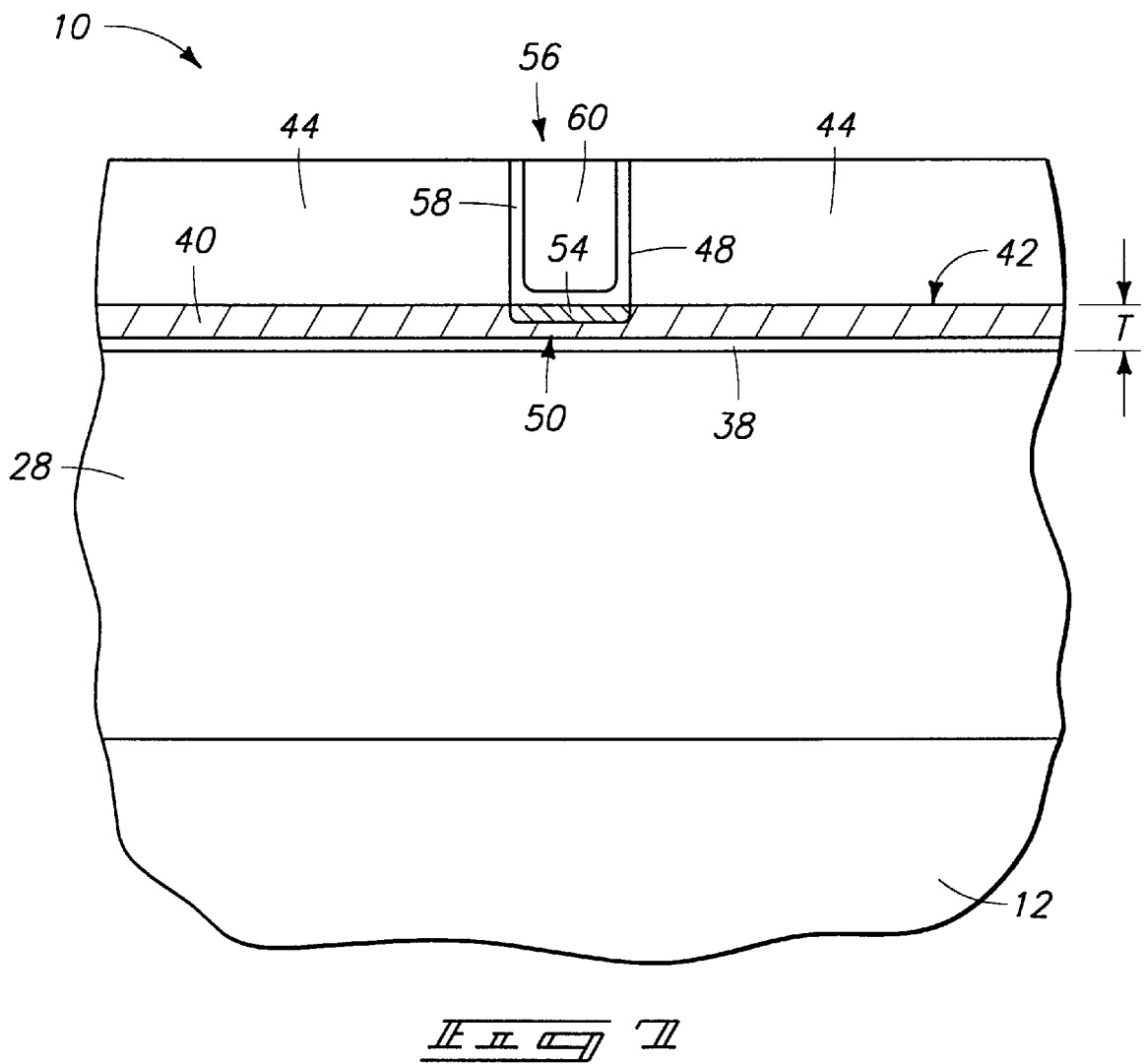
FIG. 7 is a view of the FIG. 4 wafer fragment at a processing step subsequent to that depicted by FIG. 4, and corresponding in sequence to that depicted by FIG. 6.

Referring to FIGS. 6, 7 and 8, conductive material 56 is formed within contact opening 48 in electrical connection with DRAM capacitor cell electrode layer 40 and within contact opening 46 in electrical connection with bit contact source/drain diffusion region 22. In one embodiment, conductive material 56 comprises a metal and/or metal compound which is/are capable of oxidizing to a non-conductive metal oxide upon effective exposure to the conductive metal oxide of layer 40. Preferred materials include titanium, titanium nitride, tantalum nitride, tungsten, and copper by way of example only. For example, such materials in proximity with a conductive metal oxide can form non-conducting oxides at temperatures of 200° C. and greater, which are temperatures to which the substrate is typically exposed during subsequent processing steps. Regardless in the preferred embodiment, preferably no insulative oxide is formed in the contact.

In the illustrated example, conductive material 56 comprises an initial contact layer 58 (i.e., one or more of titanium, titanium nitride, and tantalum) and a larger volume plugging material 60 (i.e., tungsten or copper). Such layers are deposited and planarized back relative to insulative layer 44 as shown.

Figure 9:
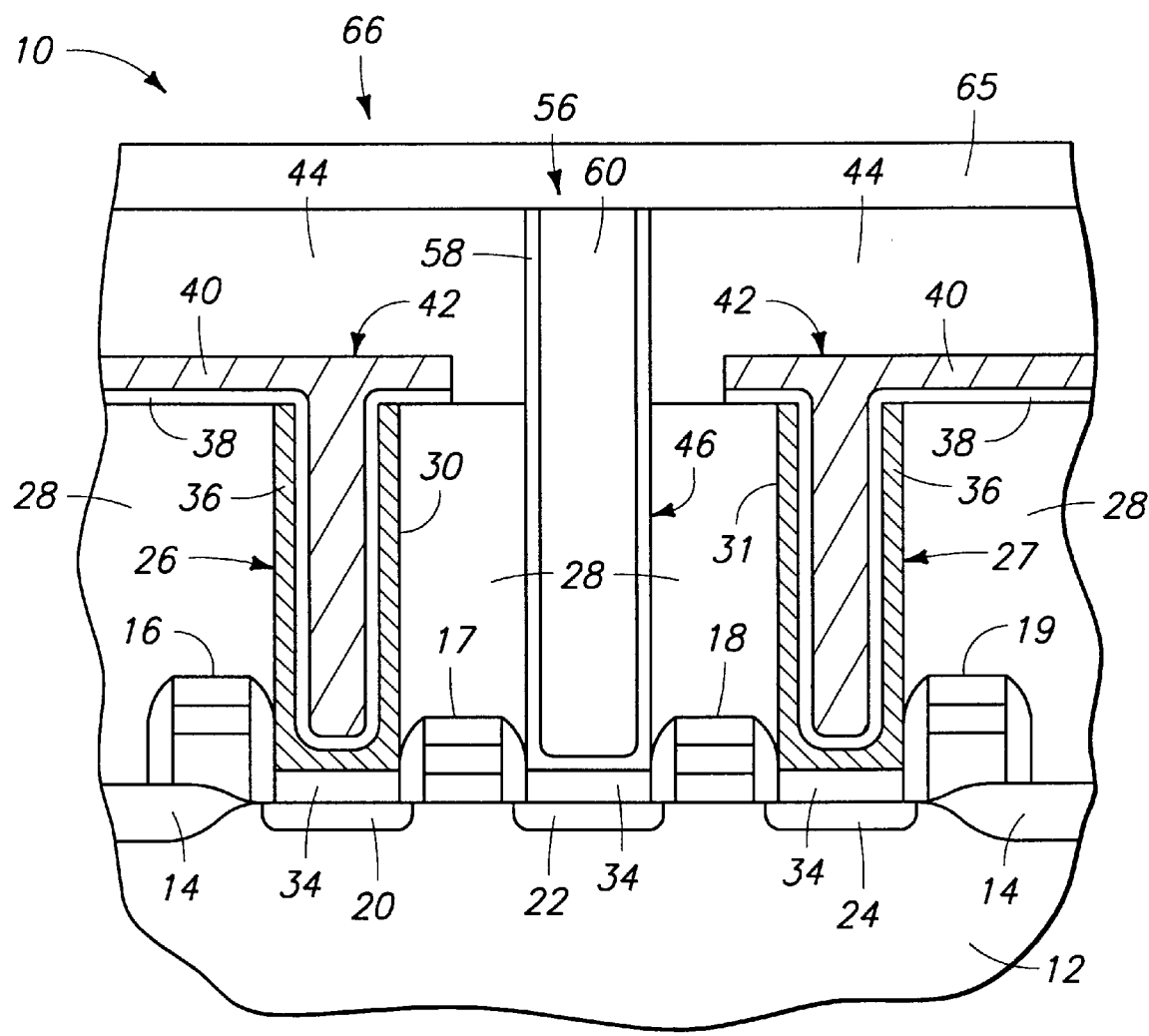
FIG. 9 is a view of the FIG. 6 wafer fragment at a processing step subsequent to that depicted by FIG. 6.
Figure 10:
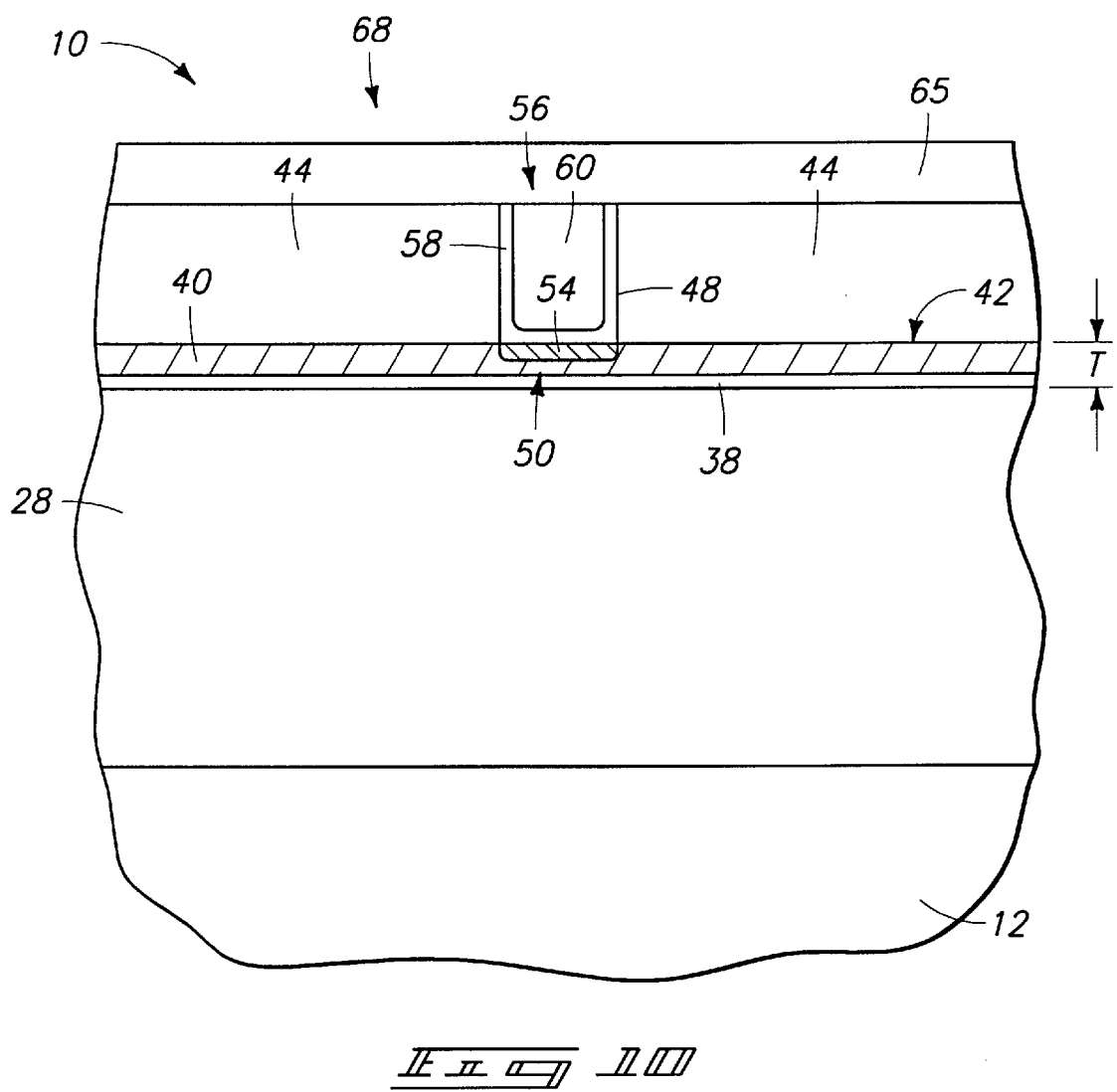
FIG. 10 is a view of the FIG. 7 wafer fragment at a processing step subsequent to that depicted by FIG. 7, and corresponding in sequence to that depicted by FIG. 9.
Figure 11:
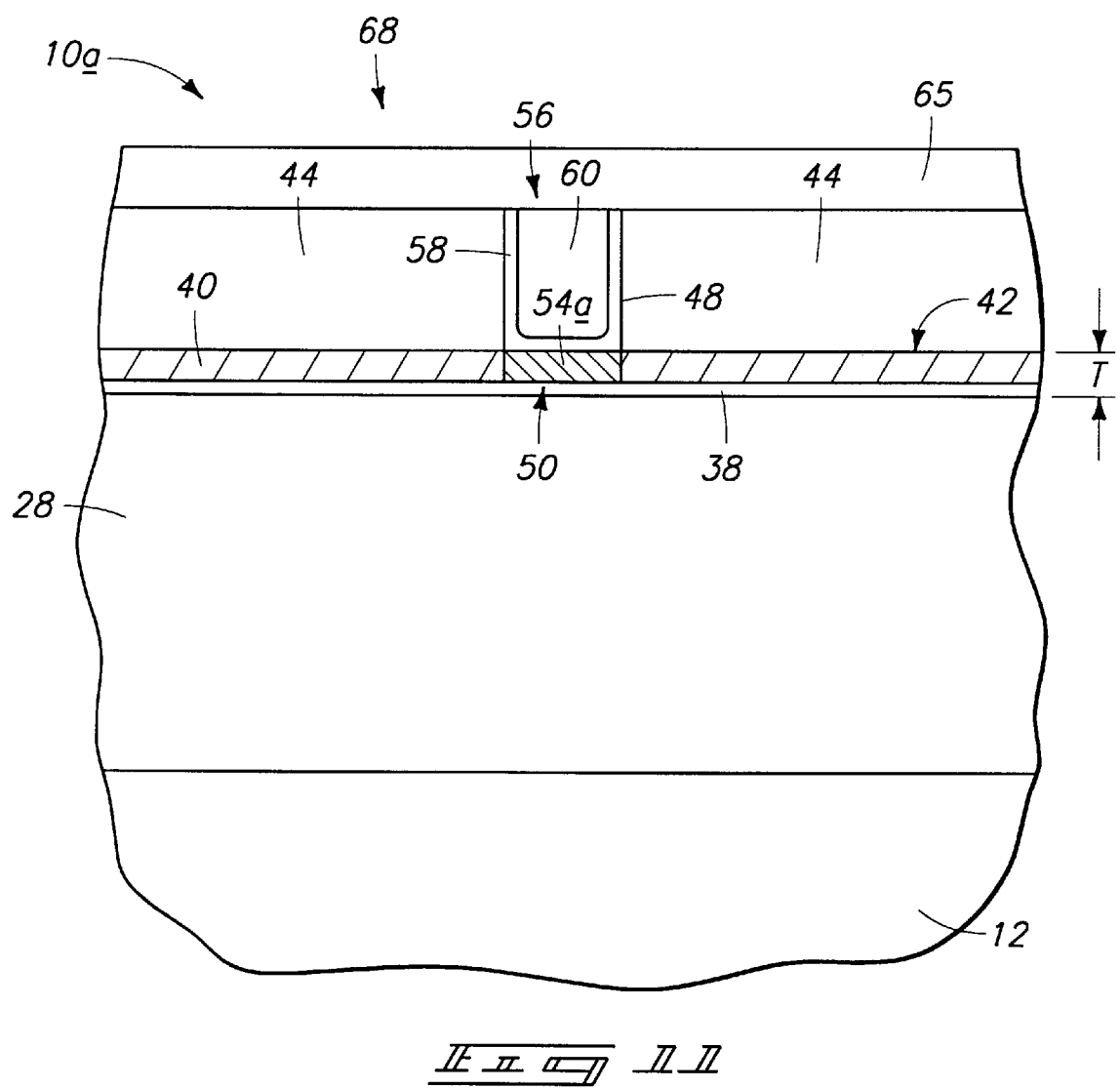
FIG. 11 is a view of the exemplary alternate embodiment, and corresponds in position and sequence to that depicted by FIG. 10.

Referring to FIGS. 9, 10 and 11, a conductive layer 65 is deposited over and in electrical connection with conductive material 56. Such is patterned as depicted in the FIG. 9 embodiment to form a DRAM bit line 66 over insulative layer 44 and in electrical connection with source/drain diffusion region 22 through a conductive material 56. Such layer is preferably also patterned relative to FIGS. 10 and 11 to form a conductive line 68 for making desired DRAM cell electrode layer electrical contact through conductive material 56 within contact opening 48. Other devices might be formed outwardly of layer 68, followed ultimately by formation of a final passivation layer.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. Integrated circuitry comprising a conductive metal oxide comprising layer received over a substrate, the conductive metal oxide comprising layer comprising at least one localized region, at least an outermost portion of the localized region comprising less oxygen content than a region of the conductive metal oxide comprising layer immediately laterally adjacent the at least one localized region.

2. The integrated circuitry of claim 1 wherein the localized region extends through an entirety of the thickness of the conductive metal oxide comprising layer, and an entirety of the localized region comprises less oxygen content than the region of the conductive metal oxide comprising layer immediately laterally adjacent the localized region.

3. The integrated circuitry of claim 1 wherein only the outermost portion of the localized region has less oxygen content than the region of the conductive metal oxide comprising layer immediately laterally adjacent the localized region.

4. The integrated circuitry of claim 1 wherein at least the outermost portion of the localized region has no more than 15 atomic percent oxygen.

5. The integrated circuitry of claim 1 wherein at least the outermost portion of the localized region is essentially void of oxygen.

6. The integrated circuitry of claim 1 wherein the localized region extends through an entirety of the thickness of the conductive metal oxide comprising layer, and an entirety of the localized region comprises less oxygen content than the region of the conductive metal oxide comprising layer immediately laterally adjacent the localized region, the entirety of the localized region having no more than 15 atomic percent oxygen.

7. Integrated circuitry comprising:
    a conductive metal oxide comprising layer received over a substrate, the conductive metal oxide comprising layer comprising a localized region, at least an outermost portion of the localized region comprising less oxygen content than a region of the conductive metal oxide comprising layer immediately laterally adjacent the at least one localized region;
    an insulative layer received over the conductive metal oxide comprising layer; and
    a conductive contact received within the insulative layer and received over the localized region and in electrical connection therewith.

8. The integrated circuitry of claim 7 wherein the conductive contact comprises a conductive material which is capable of oxidizing to a non-conducting metal oxide upon effective exposure to the conductive metal oxide.

9. The integrated circuitry of claim 7 wherein the localized region extends through an entirety of the thickness of the conductive metal oxide comprising layer, and an entirety of the localized region comprises less oxygen content than the region of the conductive metal oxide comprising layer immediately laterally adjacent the localized region.

10. The integrated circuitry of claim 7 wherein only the outermost portion of the localized region has less oxygen content than the region of the conductive metal oxide comprising layer immediately laterally adjacent the localized region.

11. The integrated circuitry of claim 7 wherein at least the outermost portion of the localized region has no more than 15 atomic percent oxygen.

12. The integrated circuitry of claim 7 wherein at least the outermost portion of the localized region is essentially void of oxygen.

13. The integrated circuitry of claim 7 wherein the localized region extends through an entirety of the thickness of the conductive metal oxide comprising layer, and an entirety of the localized region comprises less oxygen content than the region of the conductive metal oxide comprising layer immediately laterally adjacent the localized region, the entirety of the localized region having no more than 15 atomic percent oxygen.

14. Integrated circuitry comprising:
a capacitor comprising a pair of capacitor electrodes separated by a capacitor dielectric layer therebetween, at least one of the capacitor electrodes comprising a conductive metal oxide, the one capacitor electrode comprising a localized region, at least an outermost portion of the localized region comprising less oxygen content than a region of the conductive metal oxide comprising electrode immediately laterally adjacent the at least one localized region;
an insulative layer received over the capacitor; and
a conductive contact received within the insulative layer and received over the localized region of the one capacitor electrode and in electrical connection therewith.

15. The integrated circuitry of claim 14 wherein only one of the capacitor electrodes comprises a conductive metal oxide.

16. The integrated circuitry of claim 14 wherein the one of the capacitor electrodes comprises an outer capacitor electrode.

17. The integrated circuitry of claim 14 wherein the conductive contact comprises a conductive material which is capable of oxidizing to a non-conducting metal oxide upon effective exposure to the conductive metal oxide.

18. The integrated circuitry of claim 14 wherein the localized region extends through an entirety of the thickness of the one capacitor electrode, and an entirety of the localized region comprises less oxygen content than the region of the conductive metal oxide comprising electrode immediately laterally adjacent the localized region.

19. The integrated circuitry of claim 14 wherein only the outermost portion of the localized region has less oxygen content than the region of the conductive metal oxide comprising electrode immediately laterally adjacent the localized region.

20. The integrated circuitry of claim 14 wherein at least the outermost portion of the localized region has no more than 15 atomic percent oxygen.

21. The integrated circuitry of claim 14 wherein at least the outermost portion of the localized region is essentially void of oxygen.

22. The integrated circuitry of claim 14 wherein the localized region extends through an entirety of the thickness of the one capacitor electrode, and an entirety of the localized region comprises less oxygen content than the region of the conductive metal oxide comprising electrode immediately laterally adjacent the localized region, the entirety of the localized region having no more than 15 atomic percent oxygen.

23. DRAM integrated circuitry comprising:
a substrate having a DRAM wordline received thereover, the DRAM wordline comprising a gate of a DRAM cell field effect transistor which has a pair of source/drain regions;
a DRAM bit line in electrical connection with one of the pair of source/drain regions;
a DRAM cell capacitor in electrical connection with the other of the pair of source/drain regions, the DRAM capacitor comprising:
a capacitor storage node layer in electrical connection with the other of the pair of source drain regions;
a capacitor dielectric layer over the storage node electrode layer; and
a DRAM capacitor cell electrode layer over the capacitor dielectric layer and which is common to multiple capacitors of the DRAM circuitry, the DRAM capacitor cell electrode layer comprising a conductive metal oxide, the DRAM capacitor cell electrode layer comprising a localized region, at least an outermost portion of the localized region comprising less oxygen content than a region of the conductive metal oxide comprising cell electrode layer immediately laterally adjacent the at least one localized region;
an insulative layer over the DRAM capacitor; and
a conductive contact received within the insulative layer and received over the localized region of the DRAM capacitor cell electrode and in electrical connection therewith.

24. The integrated circuitry of claim 23 wherein the conductive contact comprises a conductive material which is capable of oxidizing to a non-conducting metal oxide upon effective exposure to the conductive metal oxide.

25. The integrated circuitry of claim 23 wherein the localized region extends through an entirety of the thickness of the cell electrode layer, and an entirety of the localized region comprises less oxygen content than the region of the cell electrode layer immediately laterally adjacent the localized region.

26. The integrated circuitry of claim 23 wherein only the outermost portion of the localized region has less oxygen content than the region of the cell electrode layer immediately laterally adjacent the localized region.

27. The integrated circuitry of claim 23 wherein at least the outermost portion of the localized region has no more than 15 atomic percent oxygen.

28. The integrated circuitry of claim 23 wherein at least the outermost portion of the localized region is essentially void of oxygen.

29. The integrated circuitry of claim 23 wherein the localized region extends through an entirety of the thickness of the cell electrode layer, and an entirety of the localized region comprises less oxygen content than the region of the cell electrode layer immediately laterally adjacent the localized region, the entirety of the localized region having no more than 15 atomic percent oxygen.

* * * * *